United States Patent
Dahal et al.

(10) Patent No.: US 9,151,853 B2
(45) Date of Patent: Oct. 6, 2015

(54) NEUTRON-DETECTING APPARATUSES AND METHODS OF FABRICATION

(71) Applicant: RENSSELAER POLYTECHNIC INSTITUTE, Troy, NY (US)

(72) Inventors: Rajendra P. Dahal, Troy, NY (US); Jacky Kuan-Chih Huang, Troy, NY (US); James J. Q. Lu, Watervliet, NY (US); Yaron Danon, Selkirk, NY (US); Ishwara B. Bhat, Clifton Park, NY (US)

(73) Assignee: RENSSELAER POLYTECHNIC INSTITUTE, Troy, NY (US)

( * ) Notice: Subject to any disclaimer, the term of this patent is extended or adjusted under 35 U.S.C. 154(b) by 0 days.

(21) Appl. No.: 14/074,131

(22) Filed: Nov. 7, 2013

(65) Prior Publication Data
US 2014/0252520 A1    Sep. 11, 2014

Related U.S. Application Data

(60) Provisional application No. 61/723,471, filed on Nov. 7, 2012.

(51) Int. Cl.
*H01L 31/115* (2006.01)
*G01T 3/08* (2006.01)
*H01L 27/142* (2014.01)
*G01T 3/00* (2006.01)
*H01L 31/0216* (2014.01)
*H01L 31/0352* (2006.01)

(52) U.S. Cl.
CPC ... *G01T 3/08* (2013.01); *G01T 3/00* (2013.01); *H01L 27/1428* (2013.01); *H01L 31/02161* (2013.01); *H01L 31/03529* (2013.01); *H01L 31/115* (2013.01)

(58) Field of Classification Search
CPC ............ G01T 3/00; G01T 3/08; H01L 27/14; H01L 27/142; H01L 27/1422; H01L 27/1428; H01L 31/115
USPC ............... 257/414, 428, 429, 513, 514, 622, 257/E31.001, E31.032, E27.122
See application file for complete search history.

(56) References Cited

U.S. PATENT DOCUMENTS 5,866,931 A * 2/1999 Bulucea et al. ............... 257/331
6,545,281 B1   4/2003 McGregor et al.
(Continued)

OTHER PUBLICATIONS

McGregor et al, "Self-Biased Boron-10 Coated High-Purity Epitaxial GaAs Thermal Neutron Detectors", IEEE Transactions on Nuclear Science, vol. 47, No. 4, Aug. 2000 (pp. 1364-1370).

*Primary Examiner* — Eduardo A Rodela
(74) *Attorney, Agent, or Firm* — Kevin P. Radigan, Esq.; Heslin Rothenberg Farley & Mesiti P.C.

(57) ABSTRACT

Neutron-detecting structures and methods of fabrication are provided which include: a substrate with a plurality of cavities extending into the substrate from a surface; a p-n junction within the substrate and extending, at least in part, in spaced opposing relation to inner cavity walls of the substrate defining the plurality of cavities; and a neutron-responsive material disposed within the plurality of cavities. The neutron-responsive material is responsive to neutrons absorbed for releasing ionization radiation products, and the p-n junction within the substrate spaced in opposing relation to and extending, at least in part, along the inner cavity walls of the substrate reduces leakage current of the neutron-detecting structure.

9 Claims, 7 Drawing Sheets

(56) References Cited

U.S. PATENT DOCUMENTS

| | | |
|---|---|---|
| 7,164,138 B2 | 1/2007 | McGregor et al. |
| 7,183,701 B2 | 2/2007 | Downing et al. |
| 7,372,009 B1 | 5/2008 | Losee et al. |
| 7,592,601 B2 | 9/2009 | Frank |
| 7,855,372 B2 * | 12/2010 | McGregor et al. ....... 250/390.01 |
| 8,022,369 B2 | 9/2011 | Orava et al. |
| 8,778,715 B2 | 7/2014 | Bellinger et al. |
| 2009/0302231 A1 * | 12/2009 | McGregor et al. ....... 250/390.03 |
| 2010/0304204 A1 * | 12/2010 | Routkevitch et al. ......... 429/122 |
| 2012/0235260 A1 | 9/2012 | Nikolic et al. |
| 2012/0313196 A1 * | 12/2012 | Li ................................. 257/429 |
| 2013/0334541 A1 * | 12/2013 | Voss et al. ....................... 257/77 |
| 2014/0077089 A1 * | 3/2014 | Orava et al. .............. 250/370.05 |

* cited by examiner

NEUTRON-DETECTING APPARATUSES AND METHODS OF FABRICATION

CROSS-REFERENCE TO RELATED APPLICATION

This application claims the benefit of U.S. Provisional Patent Application No. 61/723,471, filed Nov. 7, 2012, which is hereby incorporated herein by reference in its entirety.

GOVERNMENT LICENSE RIGHTS

This invention was made with government support under Contract Number DE-AC07-05ID14517, awarded by the Department of Energy, under the Nuclear Energy University Program. The Government has certain rights in the invention.

BACKGROUND

Efficient solid-state neutron-detectors with large detecting surfaces and low gamma sensitivity are desired for detecting and preventing proliferation of special nuclear materials (SNMs). Unfortunately, available neutron-detectors are limited, for instance, by size, weight, high bias voltage requirements, and/or cost due, for instance, to limited supply of enriched helium ($^3$He) gas, which is currently employed in most neutron-detectors.

Although a variety of solid-state neutron-detectors have been proposed, existing neutron-detectors often embody a trade-off between neutron-detector efficiency and gamma discrimination, as most neutron sources or reactions are generally accompanied by gamma ray events. For example, an increase in sensitivity of a neutron-detector often results in a concomitant increase in sensitivity of detecting undesired gamma ray events.

Thus, there remains a need for further neutron-detection approaches, and in particular, a need for a novel, self-powered, robust and efficient solid-state neutron-detector.

BRIEF SUMMARY

The shortcomings of the prior art are overcome and additional advantages are provided through the provision, in one aspect, of an apparatus which includes: a neutron-detecting structure. The neutron-detecting structure includes, for instance: a substrate including a plurality of cavities extending into the substrate from a surface thereof; a p-n junction within the substrate and extending, at least in part, in spaced opposing relation to inner cavity walls of the substrate defining the plurality of cavities therein; and a neutron-responsive material disposed within the plurality of cavities, the neutron-responsive material being responsive to neutrons absorbed thereby for releasing ionizing radiation reaction products, wherein the p-n junction within the substrate spaced in opposing relation to and extending, at least in part, along the inner cavity walls of the substrate reduces leakage current of the neutron-detecting structure.

In a further aspect, a method is presented which includes fabricating a neutron-detecting structure, the fabricating including: providing a substrate including a plurality of cavities extending into the substrate from a surface thereof; forming a p-n junction within the substrate and extending, at least in part, in spaced opposing relation to inner cavity walls of the substrate defining the plurality of cavities therein, the p-n junction within the substrate spaced in opposing relation to and extending, at least in part, along the inner cavity walls of the substrate reducing leakage current of the neutron-detecting structure; and providing a neutron-responsive material within the plurality of cavities, the neutron-responsive material being responsive to neutrons absorbed thereby for releasing ionizing radiation reaction products.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Aspects of the present invention and certain features, advantages, and details thereof, are explained more fully below with reference to the non-limiting embodiments illustrated in the accompanying drawings. Descriptions of well-known materials, fabrication tools, processing techniques, etc., are omitted so as to not unnecessarily obscure the invention in detail. It should be understood, however, that the detailed description and the specific examples, while indicating embodiments of the invention, are given by way of illustration only, and are not by way of limitation. Various substitutions, modifications, additions and/or arrangements within the spirit and/or scope of the underlying inventive concepts will be apparent to those skilled in the art from this disclosure. Further, note that in making reference below to the drawings (which are not drawn to scale for ease of understanding) the same reference numbers used throughout different figures designate the same or similar components.

Neutrons, being charge-less particles, tend not to ionize. However, their collisions with other nuclei often result in energetic ionization reaction products, which in turn generate electron-hole pairs (EHPs), which may be separated either by a built-in electric field or by an external bias voltage. These electron-hole pairs can be efficiently detected by solid-state semiconductor junctions, resulting in such neutron-detectors being generally used in a range of applications, including, for example, civilian and defense applications. Unfortunately, available neutron-detectors are often limited, for instance, by size, weight and high bias voltage requirements. Furthermore, the limited supply of enriched helium ($^3$He), which is currently employed in many neutron-detectors, results in significant cost constraints and performance limitations.

The realization of a chip-scale, self-powered or very low power-consuming, efficient solid-state neutron-detector utilizing matured silicon processing technology, such as disclosed herein, will provide significant cost and volume benefits, as well as allow wafer-level detector integration with, for instance, charge preamplifier and/or neutron-event counting electronics.

To summarize, as an enhancement to existing detectors, disclosed herein is an apparatus which includes a neutron-detecting structure comprising, for instance, a substrate including a plurality of cavities extending into the substrate from a surface thereof; a continuous p-n junction within the substrate and extending, at least in part, in spaced opposing relation to inner cavity walls of the substrate defining the plurality of cavities; and a neutron-responsive material disposed within the plurality of cavities. The neutron-responsive material is responsive to neutrons absorbed thereby for releasing ionizing radiation reaction products detected by the detector, and the continuous p-n junction within the substrate spaced in opposing relation to and extending, at least in part, along the inner cavity walls of the substrate advantageously reduces leakage current of the neutron-detecting structure.

In one specific embodiment, the p-n junction is formed by depositing a conformal layer of p-type dopant material at a first temperature, and annealing the conformal p-type dopant material at a second temperature, which is higher than the first temperature. Annealing at the second temperature facilitates forming the continuous p-n junction extending within the substrate in spaced opposing relation to the inner cavity walls of the substrate. In one example, the second temperature is at least about 100° C. to 300° C. higher than the first temperature. Note that the conformal layer of p-type dopant material may comprise a conformal layer of neutron-responsive material deposited within the plurality of cavities. This conformal layer of neutron-responsive material may be, for instance, a p-type dopant such as, for example, enriched boron ($^{10}$B) or a compound of enriched boron, for instance, boron carbide ($^{10}$B$_4$C) or boron nitride ($^{10}$BN).

As noted, in one embodiment, the p-n junction formed within the substrate is a continuous p-n junction and is disposed, in part, parallel to the surface of the substrate from which the plurality of cavities extend into the substrate, as well as in spaced opposing relation to the inner cavity walls of the substrate. In one specific example, the continuous p-n junction may be opposing and spaced from the surface of the substrate a greater distance than the continuous p-n junction is spaced from the inner cavity walls of the substrate. Advantageously, in operation, the substrate will include a depletion region which, due to the presence of the continuous p-n junction, extends within the substrate to at least a depth of the plurality of cavities within the substrate.

In one implementation, one or more of the plurality of cavities within the substrate is, at least in part, a hexagonal-cross-sectional-shaped cavity. For instance, the plurality of cavities may be arrayed, at least in part, in a honeycomb pattern within the substrate, which advantageously assists with mechanical stability to the resultant solid-state neutron-detecting structure.

In one embodiment, the apparatus may further include multiple neutron-detecting structures or modules such as disclosed herein, which may be advantageously electrically coupled in series. Note that the solid-state, neutron-detecting structures disclosed herein are designed or configured to operate at minimal, or even zero, bias voltage.

By way of explanation, certain embodiments of a neutron-detecting structure and methods of fabrication thereof, in accordance with one or more aspects of the present invention, are described below with reference to FIGS. 1A-1I.

Figure 1A:
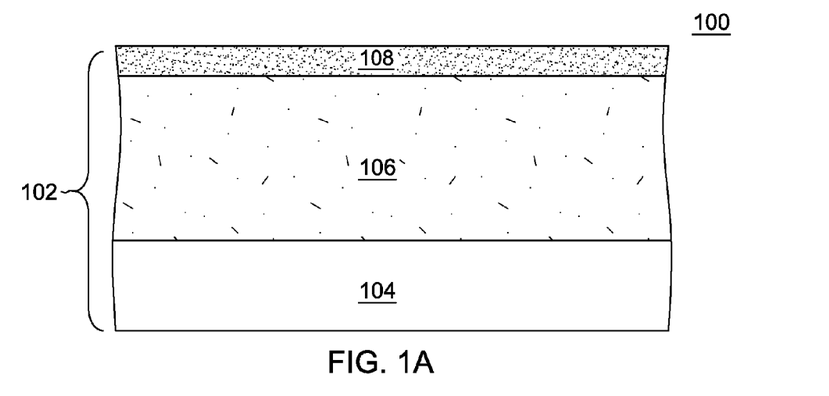
FIG. 1A is a cross-sectional elevational view of one embodiment of a structure obtained during fabrication of a neutron-detecting structure, in accordance with one or more aspects of the present invention.

FIG. 1A illustrates a structure 100 attained during fabrication of a solid-state, neutron-detecting structure, in accordance with one or more embodiments of the present invention. In the depicted embodiment, structure 100 includes a substrate 102, which as one example, may be a bulk semiconductor material, such as, for example, a bulk silicon wafer in a crystalline structure with any suitable crystallographic orientation. Suitable crystallographic orientations may include, for example, (100), (110) and (111) orientation. Although not critical to the invention, in one example, substrate 102 may have a planar (100) crystallographic surface orientation (referred to as "(100)" surface).

In the depicted example, substrate 102 has been implanted with n-type dopants to create a high-conducting n$^+$ region 104, as well as an n$^-$ region 106. Note that, n-type dopant refers to the addition of impurities to, for instance, intrinsic (undoped) substrate material, which contribute more electrons to the intrinsic material, and may include (for instance) phosphorus, arsenic or antimony. In one example, n$^+$ region 104 and n$_-$ region 106 of the substrate may be formed using conventional ion implantation or diffusion processing techniques. The n$^+$ region 104 may have a thickness in the range of about 100 to 1,000 microns, and n$^-$ region may have a thickness of about 40 μm to 50 μm. Additionally, the resistivity of n$^-$ region may be in the range of about 10-50 Ω-cm. One skilled in art will understand that n$^+$ region 104 of substrate 102 is heavily-doped with n-type dopants as compared to n$^-$ region 106 of the substrate.

Substrate 102 of structure 100 further includes a highly conducting p$^+$ region 108 disposed over n$^-$ region 106. This p$^+$ region 108 may be obtained by addition of impurities to, for instance, intrinsic (undoped) substrate material to create deficiencies of valence electrons in the intrinsic material. Examples of appropriate p-type dopant include boron, aluminum, gallium, or indium. In one example, p$^+$ region 108 of substrate 102 is formed using conventional ion implantation or diffusion processing techniques and may have thickness of about 1 to 3 μm.

Figure 1B:
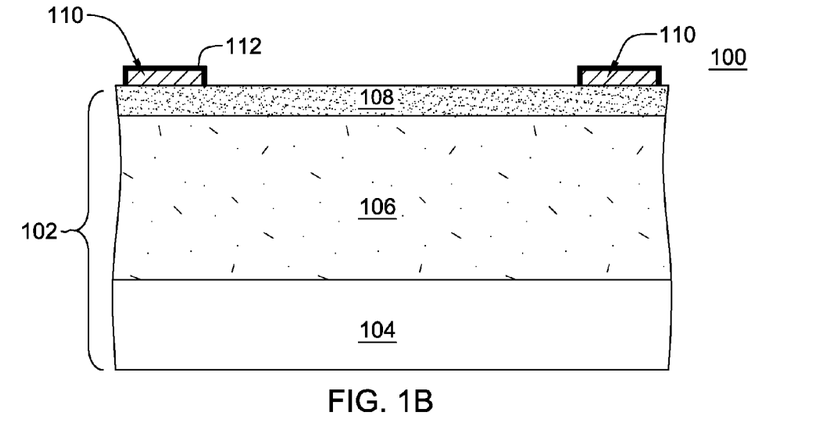
FIG. 1B depicts the structure of FIG. 1A, after electrical contacts have been provided over a surface thereof, in accordance with one or more aspects of the present invention.

FIG. 1B depicts structure 100 after provision of conductive contacts 110 over p$^+$ region 108 of the substrate. Conductive contacts 110 may be selectively patterned as desired over p$^+$ region 108, and facilitate subsequent electrical connection to the resultant neutron-detecting structure or module. Note that conductive contact material may be any of a variety of conductive materials, such as tungsten, titanium, copper, aluminum, molybdenum etc. Although not depicted, one skilled in the art will recognize that a silicide may optionally be formed by providing a layer of polysilicon over p$^+$ region of the substrate, prior to the deposition of the conductive contact material. The layer of polysilicon reacts chemically with the silicon of p$^+$ region 108 to form the silicide over p$^+$ region 108 of the substrate. In one example, the layer of polysilicon deposited over p$^+$ region 108, may have thickness in the range of about 30-50 nm, while the conductive contact material deposited over the layer of polysilicon may have thickness in the range of about 50 to 100 nm. Note that the layer of polysilicon, if provided, also acts as a buffer layer in preventing the diffusion of conductive contact material into the underlying p$^+$ region, during subsequent device processing.

A protective layer 112 may be provided over the conductive contacts 110, using, for instance, any conventional deposition processes, such as atomic layer deposition (ALD), chemical-vapor deposition (CVD), physical vapor deposition (PVD) or the like. In one example, protective layer 112 may be or include an oxide material, for instance, silicon dioxide, and may be provided to protect the conductive contacts structure, during subsequent fabrication processing.

Figure 1C:
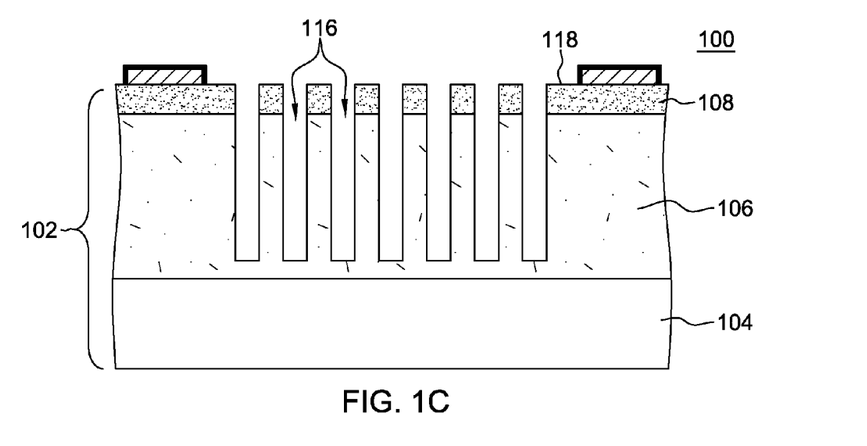
FIG. 1C depicts the structure of FIG. 1B, after etching thereof to provide a plurality of cavities within the substrate, in accordance with one or more aspects of the present invention.

As depicted in FIG. 1C, a portion of substrate 102 is patterned with a plurality of cavities 116, which extend (in the depicted example) from a surface 118 of substrate 102 into at least a portion of n$^-$ region 106 of substrate 102. Note that deep reactive ion etching (DRIE) or plasma etching process may be employed to pattern substrate 102 with a plurality of high-aspect-ratio cavities 116. In another example, an anisotropic dry etching process may alternatively (or also) be employed to pattern the cavities. In one specific example, deep reactive ion etching is performed using fluorine-based chemistry, which may involve process gases such as nitrogen trifluoride ($NF_3$), sulfur hexafluoride ($SF_6$), tetrafluoromethane ($CF_4$), trifluoromethane ($CH_3F$), difluoromethane ($CH_2F_2$), fluoromethane ($CH_3F$), octafluorocyclobutane ($C_4F_8$), hexafluoro-1,3-butadiene ($C_4F_6$) in inert gaseous medium such as argon (Ar).

In one specific example, one or more, or even each, cavity of the plurality of cavities 116 is configured with a hexagonal-cross-sectional shape. By way of example, the hexagonal-cross-sectional-shaped cavities may have a diameter in the range of about 1-3 μm and a depth of about 40-50 μm, extending into the substrate, with adjacent cavities being separated, for example, by about 1 to 1.3 μm of substrate.

Figure 1D:
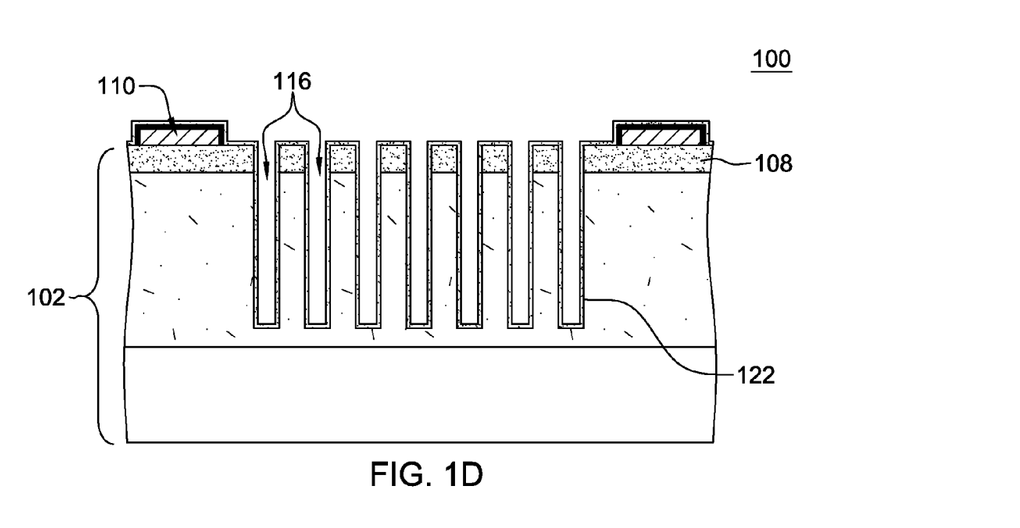
FIG. 1D depicts the structure of FIG. 1C, after provision of a conformal layer of material over the structure, including within the cavities thereof, in accordance with one or more aspects of the present invention.

As illustrated in FIG. 1D, a conformal layer 122 of material (in this example, p-type dopant material) may next be deposited. Conformal layer 122, which overlies structure 100, including within the plurality of cavities 116, may be deposited using a modified chemical vapor deposition (CVD) process. For instance, the CVD process may be modified by varying parameters such as, temperature and pressure, to obtain the desired conformal layer. Note that the conformal layer 122 of p-type dopant material may be deposited at a first temperature, for instance, in the range of about 450° C. to 550° C.

Conformal layer 122 may be or include, in one embodiment, a conformal layer of neutron-responsive material, which may be or include the p-type dopant. Examples of appropriate p-type dopants include boron, aluminum, gallium, or indium, being deposited. In one specific example, the conformal layer of neutron-responsive material may include at least one of enriched boron ($^{10}B$) or a compound of enriched boron such as, for example, boron carbide ($^{10}B_4C$, $^{10}B_5C$) or boron nitride ($^{10}BN$).

In one specific example, conformal layer 122 may be deposited using a conventional CVD process, by employing enriched boron precursors such as, for example, diborane ($B_2H_6$), deca-borane ($B_{10}H_{14}$) or other metal organoborane precursors such as, triethylborane ($(C_2H_5)_3B$) or trimethylborane ($(CH_3)_3B$), at about 500° C. Note that the enriched boron precursors employed may contain more than 95% of enriched boron ($^{10}B$) isotope. In one embodiment, thickness of the conformal layer along the inner walls of the cavities 116 may be, for example, in the range of about 10 to 20 nm. Note that the conductive contacts 110, discussed above in connection with FIG. 1B, remain unaffected by this processing, due to the low temperature conditions employed. One skilled in the art will also note that any residual layer of polysilicon that may have been deposited over p$^+$ region 108 of substrate 102, during the formation of conductive contacts 110, may be converted to silicide, under these low temperature deposition conditions, by reacting chemically with any residual underlying silicon of p$^+$ region 108, thereby further improving the quality of the conductive contacts 110.

Figure 1E:
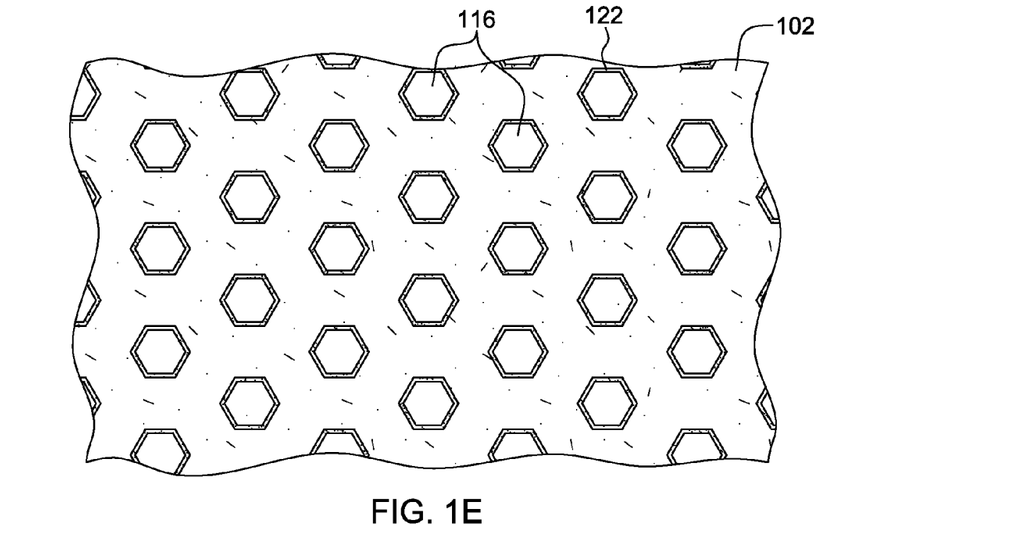
FIG. 1E is a plan-view of one embodiment of the structure of FIG. 1D, with the plurality of cavities shown arrayed in a honeycomb pattern, and the plurality of cavities being a plurality of hexagonal-cross-sectional-shaped cavities, in accordance with one or more aspects of the present invention.

By way of example, FIG. 1E is a partial cross-sectional plan view of one embodiment of a neutron-detection structure, such as described above in connection with FIGS. 1A-1D. As illustrated, in one or more embodiments, the plurality of cavities 116 of the neutron-detecting structure or module may be arrayed in a honeycomb pattern within the substrate 112. For instance, one or all the plurality of cavities may have a hexagonal-cross-sectional shape, with the resultant honeycomb pattern providing the solid-state, neutron-detecting structure with enhanced mechanical rigidity compared with other cavity configurations and layouts.

Figure 1F:
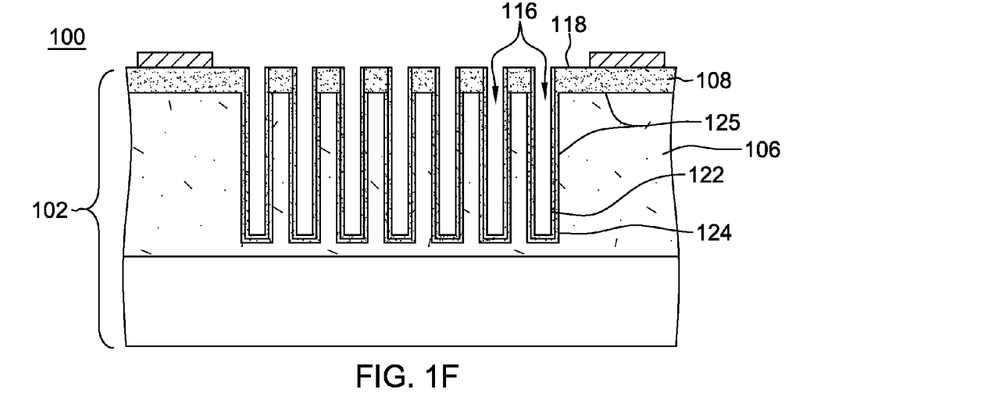
FIG. 1F depicts the structure of FIG. 1D, after a continuous p-n junction has been formed within the substrate, in accordance with one or more aspects of the present invention.

As illustrated in FIG. 1F, conformal layer 122 (of p-type dopant material) is subjected to a controlled annealing process to provide a p-region 124 within substrate 102 along the inner walls of the plurality of cavities 116. The result is to form a continuous p-n junction 125 within substrate 102 at the interface between p⁺ region 108, n⁻ region 106, and between p-region 124 and n⁻ region 106. Note that the controlled annealing to produce p-region 124 is performed at a second temperature, higher than the first temperature. This higher temperature anneal results in a portion of the p-type dopant from conformal layer 122 diffusing into the underlying n⁻ region 106 of the substrate, thereby facilitating formation of the continuous p-n junction 125 within the substrate.

Note that the second, annealing temperature is at least about 100° C. to 300° C. higher than the first temperature at which conformal layer 122 is deposited. As one specific example, continuous p-n junction 125 may be formed within substrate 102, by increasing the process temperature from 500° C. to about 700° C., for 10 to 30 minutes, to promote diffusion of p-type dopant (such as, for example, boron) from the conformal layer into the underlying n⁻ region 106 of the substrate. The thickness of p-region 124 may be controlled by controlling process parameters such as, for instance, temperature and time, at which the annealing is performed. In one example, the thickness of p-region 124 may be in the range of about 20 nm to 200 nm. In the embodiment illustrated, continuous p-n junction 125 is, in part, in spaced opposing relation to surface 118 of the substrate, and is, in part, in spaced opposing relation to the inner walls of substrate 102 defining cavities 116. As illustrated, continuous p-n junction 125 is spaced from surface 118 of the substrate 102 a greater distance than it is spaced from the inner cavity walls of the substrate. In one embodiment, conformal layer 122 may be polished back from upper surface of structure 100 using, for instance, chemical mechanical polishing, stopping on contacts 110 and p⁺ region 108 of the substrate. Note that the conformal layer of p-type dopant material disposed within cavities 116 would remain unaffected, during this etch-back polishing processing. After this polish-back, neutron-responsive material may be disposed within the cavities 116 of structure 100, in a manner such as described below.

Figure 1G:
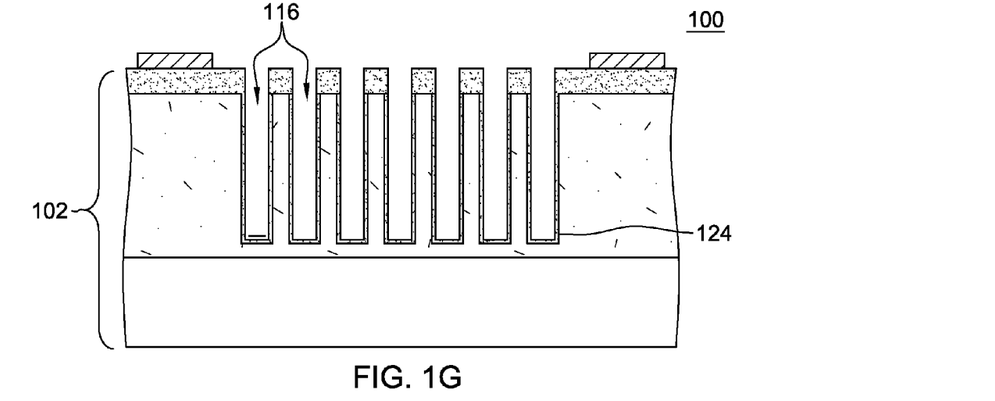
FIG. 1G depicts the structure of FIG. 1F, after optional removal of the conformal layer of material from the plurality of cavities, in accordance with one or more aspects of the present invention.
Figure 1H:
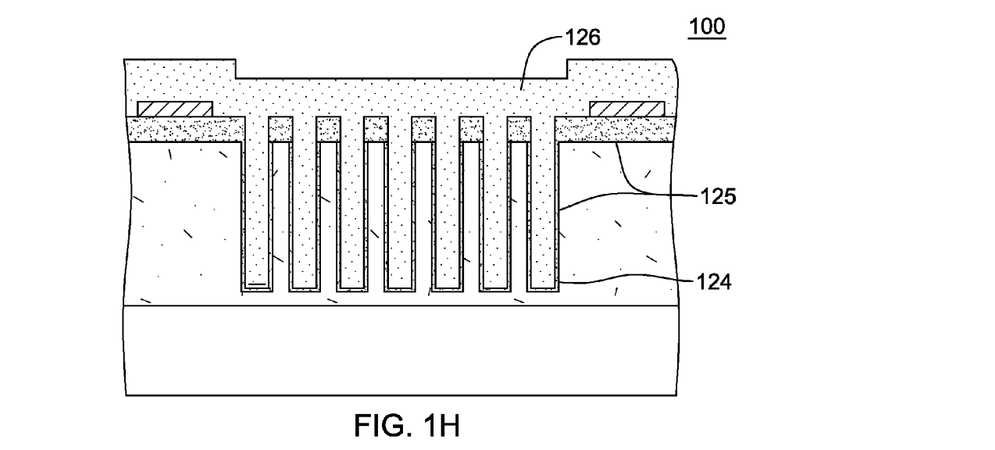
FIG. 1H depicts the structure of FIG. 1G, after deposition of neutron-responsive material within the cavities thereof, in accordance with one or more aspects of the present invention.
Figure 1I:
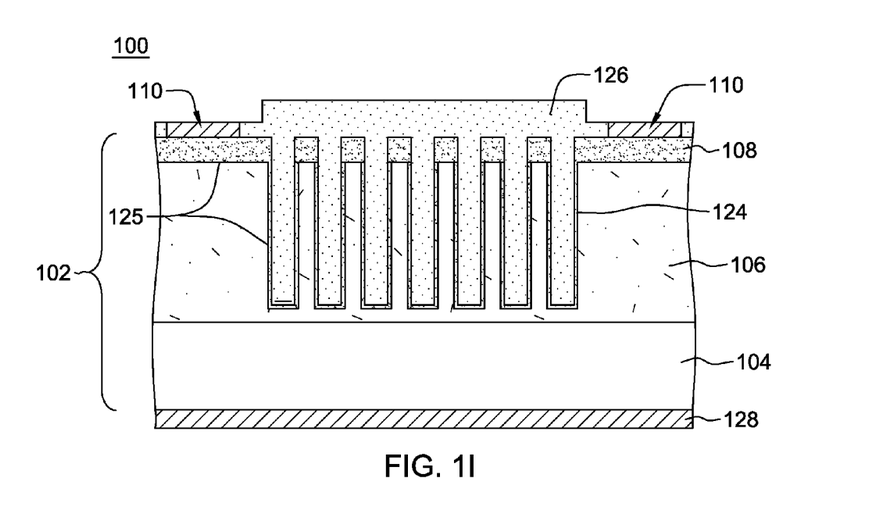
FIG. 1I depicts the structure of FIG. 1H, after etch-back of the neutron-responsive material and provision of a contact over a second surface structure, in accordance with one or more aspects of the present invention.

FIG. 1G depicts an alternate embodiment, wherein conformal layer 122 is removed from structure 100 after formation of p-region 124 within the substrate. By way of example, conformal layer 122 may be selectively removed using, for instance, a plasma formed from, for example, a mixture of oxygen ($O_2$) and a fluorine-containing gas, such as, carbon tetrafluoride ($CF_4$). In FIGS. 1H & 1I depicted below, it is assumed that the conformal layer 122 has been removed prior to provision of the neutron-responsive material within the plurality of cavities. As noted above, in an alternate implementation, the conformal layer 122 may remain within the plurality of cavities without affecting operation of the resultant neutron-detecting structure, particularly where the conformal layer comprises the above-noted enriched boron ($^{10}B$) or compounds of enriched boron.

FIG. 1H illustrates structure 100 after a neutron-responsive material 126 has been provided within cavities 116. In one embodiment, neutron-responsive material 126 may be or include at least one of enriched boron ($^{10}B$) or a compound of enriched boron such as, for example, boron carbide ($^{10}B_4C$, $^{10}B_5C$) or boron nitride ($^{10}BN$). In one specific example, neutron-responsive material 126 may be deposited using a low-temperature, high-pressure CVD process, by employing enriched boron precursors such as, for example, diborane ($B_2H_6$), deca-borane ($B_{10}H_{14}$) or other metal organoborane precursors such as, triethylborane ($C_2H_5)_3B$ or trimethylborane ($CH_3)_3B$, at about 500° C. Note that the enriched boron precursors employed herein may contain, for instance, more than 95% of enriched boron ($^{10}B$) isotope. Note also that the neutron-responsive material (for instance, enriched boron or a compound of enriched boron) advantageously facilitates absorbing thermal neutrons and converting the absorbed neutrons into energetic charged particles, thereby allowing for the detection operation of the solid-state, neutron-detecting structure. In one example, enriched boron or a compound of enriched boron has a high thermal absorption coefficient, for instance, of about 3840 barn, making enriched-boron an efficient neutron-responsive material. Additionally, large absorption lengths of neutrons in boron-rich neutron-detectors, and short escape lengths of energetic-charged particles, further enhance the efficiency of boron-rich neutron-detecting structures.

Note further that, in an alternate embodiment, neutron-responsive material 126 may comprise other materials capable of performing the neutron-detection function. For instance, the material may alternatively be or include a hydrogen-rich aromatic polymer material such as, for example, poly(p-xylylene) polymer (also referred to herein as parylene) or polystyrene.

Note that the low-temperature, high-pressure chemical vapor deposition process employed to deposit the neutron-responsive material within cavities 116 advantageously facilitates filling the cavities without defects, and thereby, enhances the efficiency of the resultant neutron-detecting structure. Although the modified deposition conditions accomplish an efficient filling of the cavities, one skilled in the art will note that with high-aspect-ratio depositions, a tear-shaped void may be created within one or more of the cavities. In the event of such an occurrence, a small portion of the neutron-responsive material may be etched using any suitable etching processing, for example, reactive ion etching, while protecting the remaining neutron-responsive material within the cavities, for instance, using a photoresist material, and subsequently be re-deposited until the tear-shaped void is removed. Alternatively, one or more small voids within the cavities may remain in place without significantly affecting operation of the resultant neutron-detecting structure.

As depicted in FIG. 1I, the neutron-responsive material 126 may be partially removed to expose conductive contacts 110 on the one side of the structure, and a conductive contact 128 may be provided on the opposite side, for instance, the under-side of the structure. In one embodiment, conductive contact 128 is provided over highly conducting n⁺ region 104 of substrate 102. Note that conductive contact 128 may be formed of any of a variety of conductive materials, such as tungsten, titanium, copper, aluminum, molybdenum etc. Although not depicted, one skilled in the art will recognize that a silicide may also be formed, for instance, by providing a layer of polysilicon over the exposed surface of n⁺ region 104, prior to the deposition of the conductive contact. The layer of polysilicon reacts chemically with the silicon of n⁺ region 104 to form silicide over the n⁺ region. In one example, the layer of polysilicon deposited over n⁺ region 104 may have thickness in the range of about 30-50 nm, while conductive contact 128 deposited over the layer of polysilicon may have thickness in the range of about 50 to 100 nm. Note that, if provided, the polysilicon will also act as a buffer layer in preventing the diffusion of conductive contact 128 into the underlying n⁺ region during subsequent fabrication processing.

Figure 2:
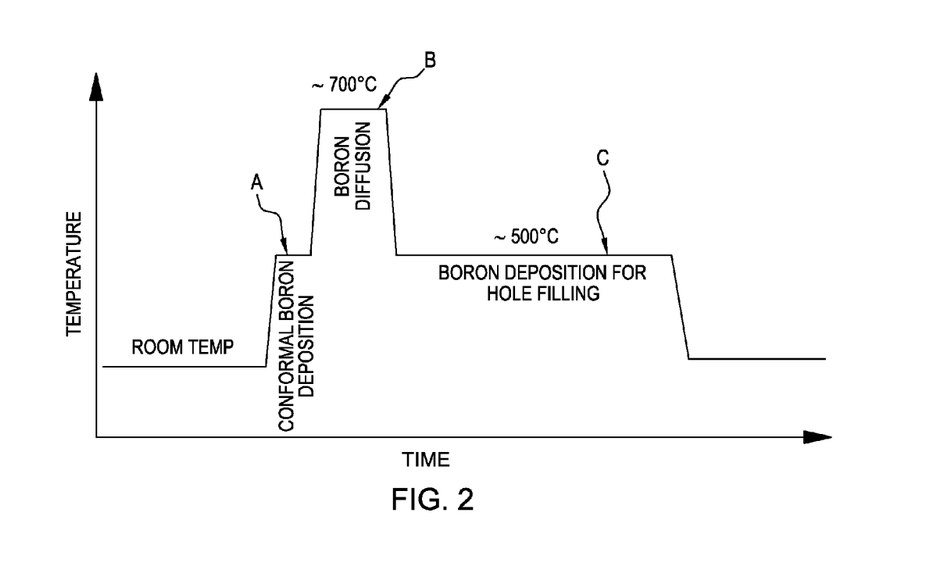
FIG. 2 is a graphical representation of one embodiment of a temperature profile utilized during deposition of the conformal layer of material, formation of the continuous p-n junction, and subsequent deposition of the neutron-responsive material within the cavities, in accordance with one or more aspects of the present invention.

By way of further example, FIG. 2 is a graphical representation of a temperature profile which may be employed during device fabrication, including deposition of a conformal layer of material, formation of the continuous p-n junction and a subsequent deposition of the neutron-responsive material within the cavities, in accordance with one or more aspects of the present invention. As discussed, in one embodiment, a conformal layer of p-type dopant material may be deposited (A), employing a low-temperature, high-pressure chemical-vapor deposition (CVD) process. As one specific example, a p-type neutron-responsive material such as, boron may be deposited within the cavities at about 500° C. The conformal layer may be subjected to an annealing process (B) by increasing the process temperature by about 100° C. to 300° C. for a short time duration, for example, about 10 mins to 30 mins, resulting in diffusion of a portion of p-type material (for example, boron) into the underlying substrate, thereby forming the portion of the p-n junction within the substrate extending, at least in part, in spaced opposing relation to the inner cavity walls of the substrate. The neutron-responsive material may subsequently be deposited (C) within the cavities, during which the temperature of the CVD process is lowered to about 500° C. and the pressure is increased by about 100 ton, as compared to a conventional CVD process. Note that these modified process parameters efficiently improve the deposition rate of the neutron-responsive material within the cavities. In one specific example, the deposition rate at which the neutron-responsive material is deposited may be in the range of about 1.5 to 2 μm/hr. Note that efficiency of the resultant neutron-detecting structure may depend on the particular process parameters, such as temperature and pressure, used during chemical-vapor deposition of the neutron-responsive material.

The efficiency of neutron-detecting structures may be further enhance by patterning a silicon substrate having (110) crystallographic orientation, with a plurality of cavities using, for example, highly-selective, conventional wet-etching processes. In such an example, the inner cavity walls may have (111) and (100) crystallographic orientations, and a controlled, low-pressure CVD process may be employed to deposit the neutron-responsive material.

Figure 3:
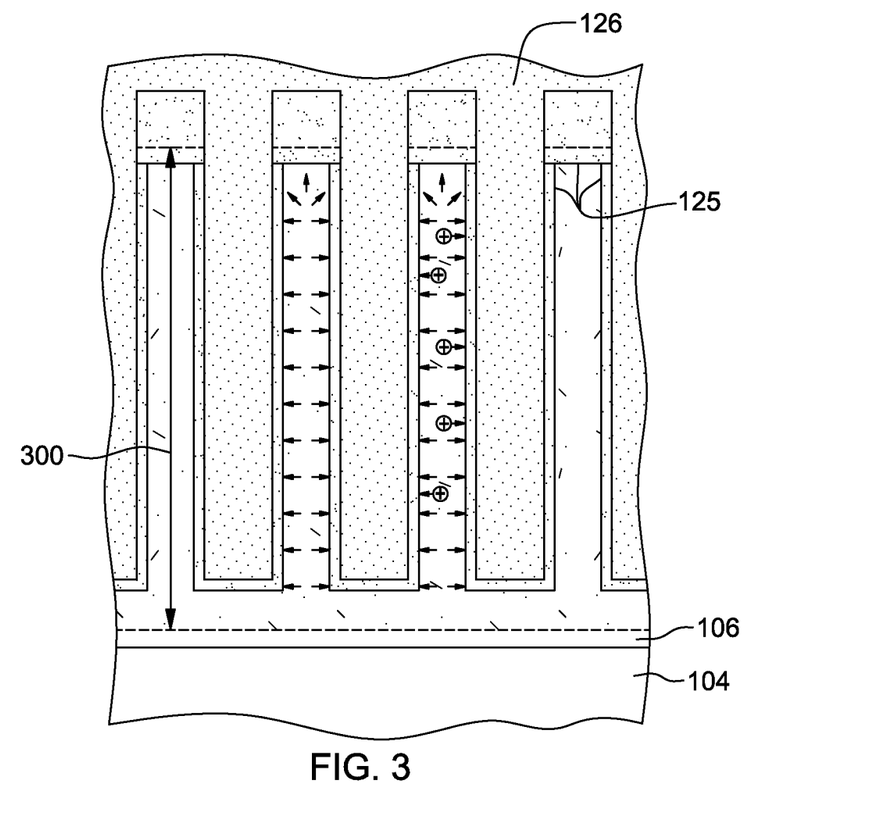
FIG. 3 is an enlarged depiction of the neutron-detecting structure of FIG. 1I, showing an enlarged depletion region within the substrate due to the presence of the continuous p-n junction, in accordance with one or more aspects of the present invention.

As an operational example, FIG. 3 depicts an enlarged partial view of the structure of FIG. 1I. In this example, an increased depletion region 300 (i.e., compared with the depletion region of a conventional neutron-detector) is formed within the substrate due to the presence of the continuous p-n junction 125 wrapping around the cavities. Note that continuous p-n junction 125 may act as a passivation layer along the inner walls of cavities 116, as well as provide a built-in electric field in the radial direction which completely depletes the adjoining inner walls of the substrate without any external biasing voltage, thereby increasing the area of the depletion region within the substrate. Passivation of the substrate using continuous p-n junction 125, and the increased size of depletion region 300 within the substrate, advantageously facilitate reducing leakage current and capacitance of the resultant neutron-detecting structure, and thereby facilitate producing devices with large collection surface areas, and improved charge collection efficiency, with minimal external bias voltage required. As noted, the continuous p-n junction may even operate at zero bias voltage.

Those skilled in the art will note that the reverse leakage current $I_o$ of the detector depends on diffusion current and recombination current. The diffusion current is given by:

$$I_{od} = qA \frac{D_p n_i^2}{L_p N_D},$$

where $I_{od}$ is the diffusion part of the reverse leakage current, A is the detector area, $D_p$ and $L_p$ are the diffusion coefficient and diffusion length of the n-type silicon respectively, $n_i$ is the intrinsic carrier concentration for intrinsic silicon, and $N_D$ is the doping concentration of n-type silicon respectively.

The recombination current is given by:

$$I_{or} = \frac{q n_{iAW}}{2\tau_o},$$

where W is the depletion layer width, and $\tau_o$ is approximately an average of electron and hole lifetime and depends on the location of the recombination center in the bandgap.

As noted, the continuous p-n junction disclosed herein advantageously facilitates in preventing the n⁻ region from being exposed (except at the edge of the neutron-detector), thereby resulting in a residual leakage current principally due to any recombination current. Note also that the n⁻ region remains unaffected further reducing the diffusion current, and the depletion region extends along the inner walls of the plurality of cavities, thereby further reducing the leakage current.

By way of further example, FIGS. 4A-4F depicts another embodiment of a neutron-detecting structure and methods of fabrication thereof, in accordance with one or more aspects of the present invention.

Figure 4A:
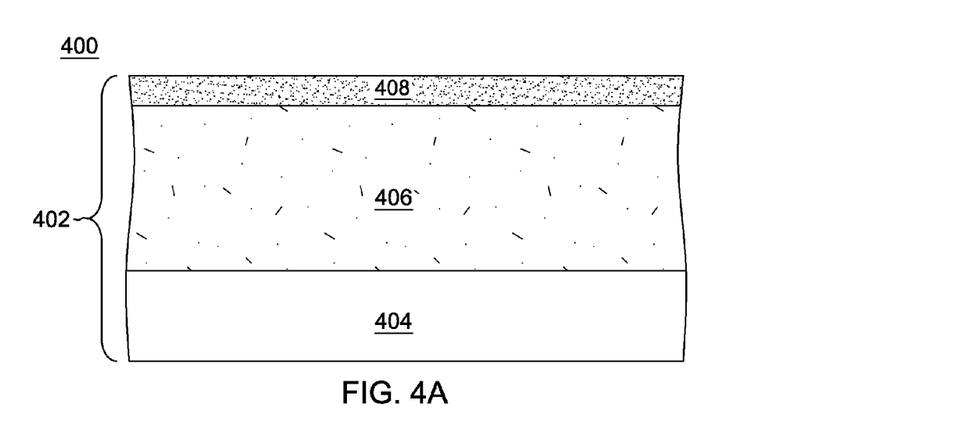
FIG. 4A is a cross-sectional elevational view of another embodiment of a structure obtained during fabrication of neutron-detecting structure, in accordance with one or more aspects of the present invention.

FIG. 4A illustrates a structure 400 attained during fabrication of a solid-state neutron-detecting structure, in accordance with one or more aspects of the present invention. In this embodiment, structure 400 includes a substrate 402, which may be a bulk semiconductor material, such as, for example, a bulk silicon wafer in a crystalline structure with any suitable crystallographic orientation. Suitable crystallographic orientations may include, for example, (100), (110) and (111) orientation. Although not critical to the invention, in one example, substrate 402 may have a planar (100) crystallographic surface orientation (referred to as "(100)" surface).

Substrate 402 has been implanted with n-type dopants to create a high-conducting n⁺ region 404, as well as an n⁻ region 406. Note that, n-type dopant refers to the addition of impurities to, for instance, intrinsic (undoped) substrate material, which contribute more electrons to the intrinsic material, and may include (for instance) phosphorus, arsenic or antimony. In one example, n⁺ region 404 and n⁻ region 406 of the substrate may be formed using conventional ion implantation or diffusion processing techniques and the n⁺ region 404 may have a thickness in the range of about 1 to 3, and n⁻ region may have a thickness of about 40 μm to 50 μm. Additionally, the resistivity of n⁻ region may be in the range of about 10-50 Ω-cm. One skilled in art will understand that the n⁺ region 404 of substrate 402 is heavily-doped with n-type dopants as compared to n⁻ region 406 of the substrate.

Substrate 402 of structure 400 further includes a high-conducting p⁺ region 408 disposed over n⁻ region 406. This p⁺ region 408 may be obtained by addition of impurities to, for instance, intrinsic (undoped) substrate material to create deficiencies of valence electrons in the intrinsic material. Examples of appropriate p-type dopant may include boron, aluminum, gallium, or indium. In one example, p⁺ region 408 of substrate 402 is formed using conventional ion implantation or diffusion processing techniques and may have thickness of about 1 to 3 μm.

Figure 4B:
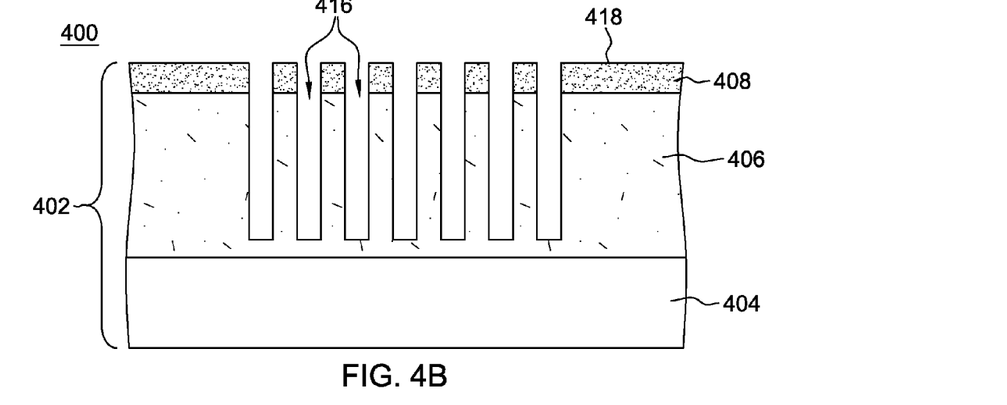
FIG. 4B depicts the structure of FIG. 4A, after etching thereof to provide a plurality of cavities within the substrate, in accordance with one or more aspects of the present invention.

As depicted in FIG. 4B, a portion of substrate 402 may be patterned with a plurality of cavities 416, which extend (in the depicted example) from a surface 418 of substrate 402 into at least a portion of n⁻ region 406 of substrate 402. Note that a deep reactive ion etching (DRIE) or plasma etching may be employed to pattern substrate 402 with a plurality of high-aspect-ratio cavities 416. In another example, an anisotropic dry etching process may alternatively (or also) be employed to pattern the cavities. In one specific example, deep reactive ion etching is performed using fluorine-based chemistry, which may involve process gases such as nitrogen trifluoride ($NF_3$), sulfur hexafluoride ($SF_6$), tetrafluoromethane ($CF_4$), trifluoromethane ($CH_3F$), difluoromethane ($CH_2F_2$), fluoromethane ($CH_3F$), octafluorocyclobutane ($C_4F_8$), hexafluoro-1,3-butadiene ($C_4F_6$) in inert gaseous medium such as argon (Ar).

In one specific example, one or more, or even each cavity of the plurality of cavities 416 is configured with a hexagonal-cross-sectional shape. By way of example, the hexagonal-cross-sectional-shaped cavities may have a diameter in the range of about 1-3 μm and a depth of about 40-50 μm, extending into the substrate, with adjacent cavities being separated, for example, by about 1 to 1.3 μm of substrate.

Figure 4C:
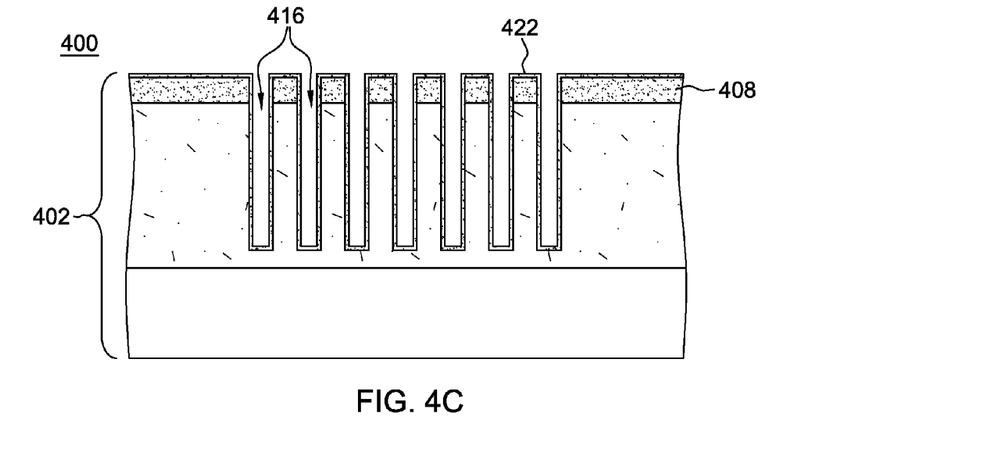
FIG. 4C depicts the structure of FIG. 4B, after deposition of a conformal layer of material over the structure, including within the cavities thereof, in accordance with one or more aspects of the present invention.

As illustrated in FIG. 4C, a conformal layer 422 of material may next be deposited. Conformal layer 422, which overlies structure 400, including within the plurality of cavities 416, may be deposited using a modified chemical vapor deposition (CVD) process. For instance, the CVD process may be modified by varying parameters such as temperature and pressure, to obtain the desired conformal layer. Note that the conformal layer 422 (e.g., of a p-type dopant material) may be deposited at a first temperature, for instance, in the range of about 450° C. to 550° C. Conformal layer 422 may be or include, in one embodiment, a conformal layer of neutron-responsive material, which may be or include the p-type dopant. Examples of appropriate p-type dopant include boron, aluminum, gallium, or indium. In one specific example, the conformal layer of neutron-responsive material may include at least one of enriched boron ($^{10}B$) or a compound of enriched boron such as, for example, boron carbide ($^{10}B_4C$, $^{10}B_5C$) or boron nitride ($^{10}BN$).

In one specific example, conformal layer 422 may be deposited using a conventional CVD process, by employing enriched boron precursors such as, for example, diborane ($B_2H_6$), deca-borane ($B_{10}H_{14}$) or other metal organoborane precursors such as, triethylborane ($C_2H_5)_3B$ or trimethylborane ($CH_3)_3B$, at about 500° C. Note that the enriched boron precursors employed may contain more than 95% of enriched boron ($^{10}B$) isotope. In one embodiment, thickness of the conformal layer along the inner walls of cavities 416 may be, for example, in the range of about 10 to 20 nm.

Figure 4D:
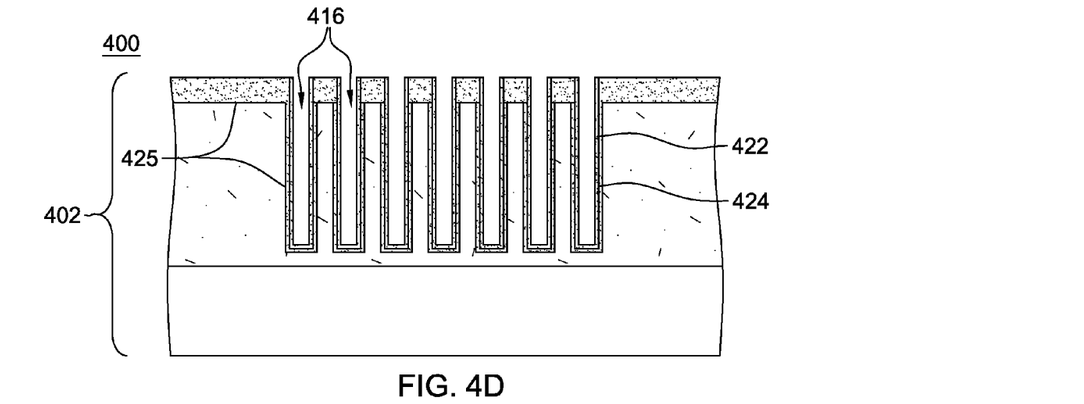
FIG. 4D depicts the structure of FIG. 4C, after a continuous p-n junction has been formed within the substrate, in accordance with one or more aspects of the present invention.

As illustrated in FIG. 4D, conformal layer 422 (of p-type dopant material) is subjected to a controlled annealing process to provide a p-region 424 within substrate 402 along the inner walls of the plurality of cavities 416. The result is to form a continuous p-n junction 425 within substrate 402 at the interface, between $p^+$ region 408 and $n^-$ region 406, and between p-region 424 and $n^-$ region 406. Note that the controlled annealing to produce p-region 424 is performed at a second temperature, higher than the first temperature. This higher temperature anneal results in a portion of the p-type dopant from conformal layer 422 diffusing into underlying $n^-$ region 406 of the substrate, thereby facilitating formation of the continuous p-n junction 425 within the substrate.

Note that the second, annealing temperature is at least about 100° C. to 300° C. higher than the first temperature at which conformal layer 422 is deposited. As a specific example, a continuous p-n junction 425 may be formed within substrate 402, by increasing temperature from 500° C. to about 700° C., for about 10 mins to 30 mins, to promote diffusion of p-type dopant (such as, for example, boron) from the conformal layer into the underlying $n^-$ region 406 of the substrate. The thickness of p-region 424 may be controlled by controlling process parameters such as, for instance, temperature and time, at which the annealing is performed. In one example, the thickness of p-region 424 may be in the range of about 20 nm to 200 nm. As illustrated, continuous p-n junction 425 is, in part, in a spaced opposing relation to surface 418 of the substrate, and is, in part, in spaced opposing relation to the inner walls of substrate 402 defining cavities 416. In the embodiment illustrated, continuous p-n junction 425 is spaced from surface 418 of substrate 402 a greater distance than it is spaced from the inner cavity walls of the substrate. In one embodiment, conformal layer 422 may be polished back from upper surfaces of structure 400 using, for instance, chemical mechanical polishing, stopping on $p^+$ region 408 of the substrate. Note that the conformal layer of p-type material disposed within cavities 416 remains unaffected, during this etch-back polishing process.

Figure 4E:
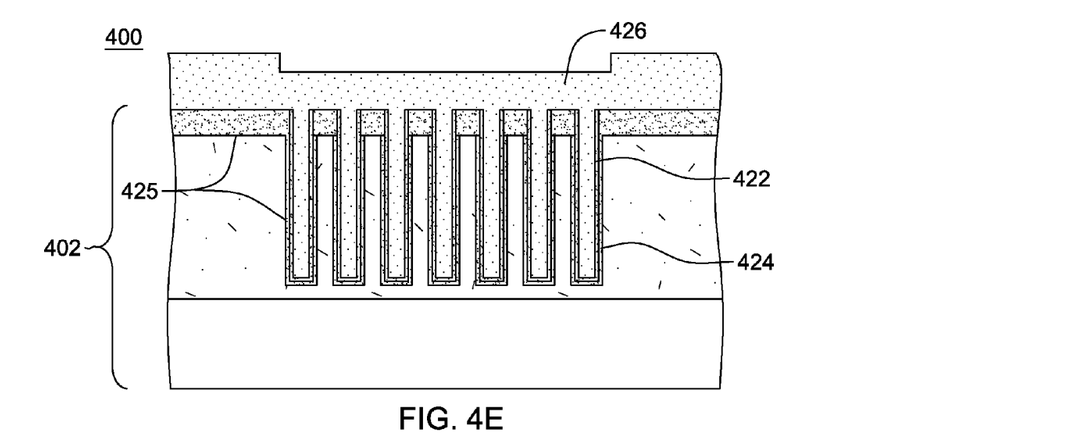
FIG. 4E depicts the structure of FIG. 4D, after deposition of neutron-responsive material within the cavities thereof, in accordance with one or more aspects of the present invention.

FIG. 4E illustrates structure 400 after a neutron-responsive material 426 has been provided within cavities 416. In one embodiment, neutron-responsive material 426 may be or include at least one of enriched boron ($^{10}B$) or a compound of enriched boron such as, for example, boron carbide ($^{10}B_4C$, $^{10}B_5C$) or boron nitride ($^{10}BN$). In one specific example, neutron-responsive material 426 may be deposited using a low-temperature, high-pressure CVD process, by employing enriched boron precursors such as, for example, diborane ($B_2H_6$), deca-borane ($B_{10}H_{14}$) or other metal organoborane precursors such as, triethylborane ($C_2H_5)_3B$ or trimethylborane ($CH_3)_3B$, at about 500° C. Note that the enriched boron precursors employed herein may contain, for instance, more than 95% of enriched boron ($^{10}B$) isotope. Note also that the neutron-responsive material (for instance, enriched boron or a compound of enriched boron) advantageously facilitates absorbing thermal neutrons and converting the absorbed neutrons into energetic charged particles, thereby allowing for the detection operation of the solid-state, neutron-detecting structure.

Note further that, in an alternate embodiment, neutron-responsive material 426 may comprise other materials capable of performing the neutron-detection function. For instance, the material may alternatively be or include a hydrogen-rich aromatic polymer material such as, for example, polyp-xylylene) polymer (also referred to herein as parylene) or polystyrene.

Note that the low-temperature, high-pressure chemical vapor deposition process employed to deposit the neutron-responsive material within cavities 416 advantageously facilitates filling the cavities without defects and thereby, enhances the efficiency of the resultant neutron-detecting structure. Although the modified deposition conditions accomplish an efficient filling of the cavities, one skilled in the art will note that with high-aspect-ratio depositions, a tear-shaped void may be created within one or more of the cavities. In the event of such an occurrence, a small portion of the neutron-responsive material may be etched using any suitable etching processing, for example, reactive ion etching, while protecting the remaining neutron-responsive material within the cavities, for instance, using a photoresist material, and subsequently be re-deposited until the tear-shaped void is removed. Alternatively, one or more small voids within the cavities may remain in place without significantly affecting operation of the resultant neutron-detecting structure.

Figure 4F:
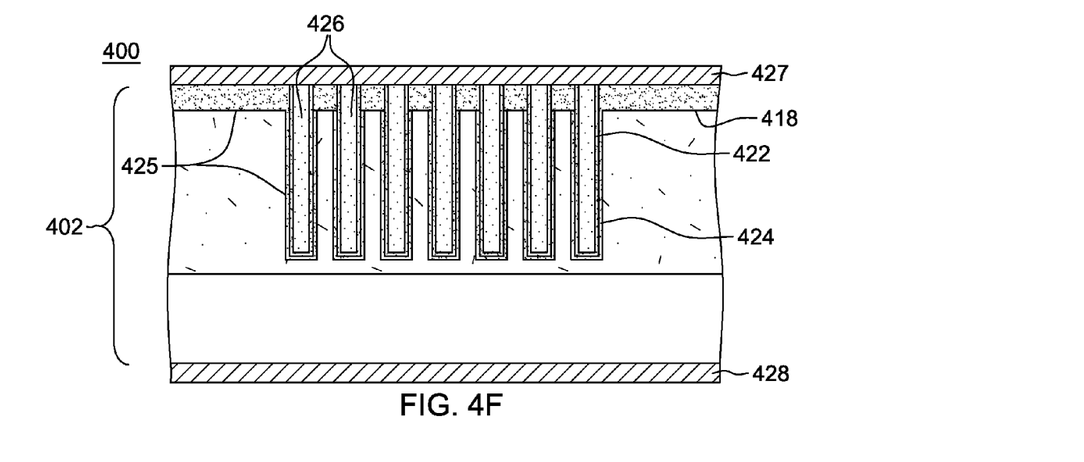
FIG. 4F depicts the structure of FIG. 4E, after contacts have been provided over opposite surfaces thereof for electrical connection to the neutron-detecting structure, in accordance with one or more aspects of the present invention.

As depicted in FIG. 4F, the neutron-responsive material 426 may be etched back or partially removed and conductive contacts 427, 428 may be provided on opposite sides of the structure. Note that, in one embodiment, conductive contact 427 resides over high-conducting p$^+$ region 408, and conductive contact 428 resides over the opposite side, that is, over high-conducting n$^-$ region 404 of the substrate. Note also that conductive contacts 427, 428 may be formed of any of a variety of conductive materials, such as tungsten, titanium, copper, aluminum, molybdenum etc. Although not depicted, one skilled in the art will recognize that a silicide may be formed, for instance, by providing polysilicon over p$^+$ region 408 and over n$^+$ region 404 of the substrate, prior to the deposition of the conductive contacts. As noted above, polysilicon reacts chemically with the silicon of p$^+$ region 408 and the silicon of n$^+$ region 404 to form silicide over the p$^+$ region and the n$^+$ region. In one example, the polysilicon deposited over p$^+$ region 408 and n$^+$ region 404, may have thickness in the range of about 30-50 nm, while conductive contacts 427, 428 may have thickness in the range of about 50 to 100 nm. Note that, if provided, the polysilicon will also act as a buffer layer in preventing the diffusion of conductive contacts 427, 428 into the underlying p$^+$ and n$^+$ regions, during subsequent fabrication processing.

Those skilled in the art will note from the above discussion that neutron-detector structures are provided herein with reduced leakage current. These neutron-detector structures with reduced leakage current advantageously enable large collection surfaces to be fabricated employing, for instance, a single preamplifier, by electrically connecting multiple neutron-detector structures or modules in series. Further, formation of a continuous p-n junction within the neutron-detector structure disclosed enables the three-dimensional, micro-structured, solid-state, neutron-detector to be operated at minimal or zero bias voltage, thereby providing a low-power consumption detector, and a low-noise detection capability, which significantly simplifies electronic circuit design. In one example, the thermal neutron-detection efficiency and gamma-to-neutron sensitivity were observed to be about 26±0.5% and (1.1±0.1)×10$^{-5}$, respectively. Additionally, in certain embodiments, the plurality of cavities is a plurality of hexagonal-cross-sectional-shaped cavities arrayed in a honeycomb pattern, which facilitates absorbing thermal neutrons in a radial direction. The honeycomb pattern also avoids any possible streaming effects, as well as assisting in mechanical stability of neutron-detecting structure. As noted, multiple neutron-detecting structures may be electrically coupled in series to reduce the overall capacitance of the neutron-detecting sensor, and in turn, reduce noise. The detectors and fabrication methods disclosed herein facilitate neutron-detecting sensors with large detection surface areas.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. An apparatus comprising:
a neutron-detecting structure, the neutron-detecting structure comprising:
a substrate comprising a plurality of cavities extending into the substrate from a surface thereof;
a p-n junction within the substrate and extending, at least in part, in spaced opposing relation to inner cavity walls of the substrate defining the plurality of cavities therein;
a neutron-responsive material disposed within the plurality of cavities, the neutron-responsive material being responsive to neutrons absorbed thereby for releasing ionizing radiation reaction products, wherein the p-n junction within the substrate spaced in opposing relation to and extending, at least in part, along the inner cavity walls of the substrate reduces leakage current of the neutron-detecting structure;
wherein the p-n junction within the substrate is a continuous p-n junction, the continuous p-n junction being disposed, in part, parallel to the surface of the substrate from which the plurality of cavities extend into the substrate, as well as in spaced opposing relation to the inner cavity walls of the substrate; and
wherein the continuous p-n junction is spaced from the surface of the substrate a greater distance than the continuous p-n junction is spaced in opposing relation to the inner cavity walls of the substrate.

2. The apparatus of claim 1,
wherein, in operation, the substrate comprises a depletion region, the depletion region extending within the substrate to at least a depth of the plurality of cavities within the substrate.

3. The apparatus of claim 2, wherein the depletion region of the substrate resides, at least in part, within an n$^-$ region of the substrate, the n$^-$ region of the substrate being above an n$^+$ region of the substrate.

4. The apparatus of claim 1, wherein at least one cavity of the plurality of cavities within the substrate is, at least in part, a hexagonal-cross-sectional-shaped cavity.

5. The apparatus of claim 1, wherein the plurality of cavities are arrayed, at least in part, in a honeycomb pattern within the substrate.

6. The apparatus of claim 1, further comprising multiple neutron-detecting structures, the neutron-detecting structure being one neutron-detecting structure of the multiple neutron-detecting structures, and wherein the multiple neutron-detecting structures are electrically coupled in series.

7. The apparatus of claim 1, wherein the neutron-detecting structure is designed to operate at zero bias voltage.

8. The apparatus of claim 1, wherein the p-n junction extends into the substrate, parallel to the inner cavity walls thereof to at least a depth of a cavity of the plurality of cavities within the substrate.

9. The apparatus of claim 1, wherein the p-n junction extends into the substrate conformally about the plurality of cavities within the substrate.

\* \* \* \* \*